United States Patent
Huang et al.

(10) Patent No.: US 6,458,650 B1
(45) Date of Patent: Oct. 1, 2002

(54) CU SECOND ELECTRODE PROCESS WITH IN SITU ASHING AND OXIDATION PROCESS

(75) Inventors: Yi-Chen Huang, Hsin-Chu; Li-Chih Chao, Yang-mei; Chao-Chen Chen, Matou, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/908,821

(22) Filed: Jul. 20, 2001

(51) Int. Cl.$^7$ .......................................... H01L 21/8242
(52) U.S. Cl. ..................... 438/253; 438/396; 438/687
(58) Field of Search ................... 438/3, 240, 253–256, 438/396–399, 238, 381, 687

(56) References Cited

U.S. PATENT DOCUMENTS

| | | |
|---|---|---|
| 5,434,109 A | 7/1995 | Geissler et al. ............. 437/239 |
| 6,072,227 A | 6/2000 | Yau et al. .................... 257/642 |
| 6,127,089 A | 10/2000 | Subramanian et al. ....... 430/270 |
| 6,143,598 A | * 11/2000 | Martin et al. ................ 438/240 |
| 6,153,514 A | 11/2000 | Wang et al. ................. 438/640 |
| 6,303,426 B1 | * 10/2001 | Alers ........................... 438/240 |

* cited by examiner

*Primary Examiner*—Jey Tsai
(74) *Attorney, Agent, or Firm*—George O. Saile; Stephen B. Ackerman

(57) ABSTRACT

A new method is provided for the creation of an opening over which the second electrode of a MIM capacitor is to be deposited. The first electrode of the MIM is created in a first layer of Fluorine doped Silicon dioxide ($SiO_2$) Glass (FSG). A layer of insulation comprising silicon nitride is deposited over the surface of the first electrode. A second layer of Fluorine doped Silicon dioxide ($SiO_2$) Glass (FSG) is deposited over the surface of the layer of silicon nitride, an etch stop layer of silicon nitride is deposited over the surface of the second layer of FSG. The layers of etch stop and the second layer of FSG are patterned and etched using a dry etch, stopping on the layer-of insulation and exposing the surface of the layer of insulation. Next-and of critical importance to the invention is a step of photoresist ashing and oxidation of the surface of the layer of silicon nitride. The layer of photoresist can now be removed while concurrently, using a wet strip, the layer of silicon nitride oxidation is removed from the surface of the layer of silicon nitride. The process of creating a MIM capacitor can then proceed by creating the second electrode of the MIM capacitor.

23 Claims, 5 Drawing Sheets

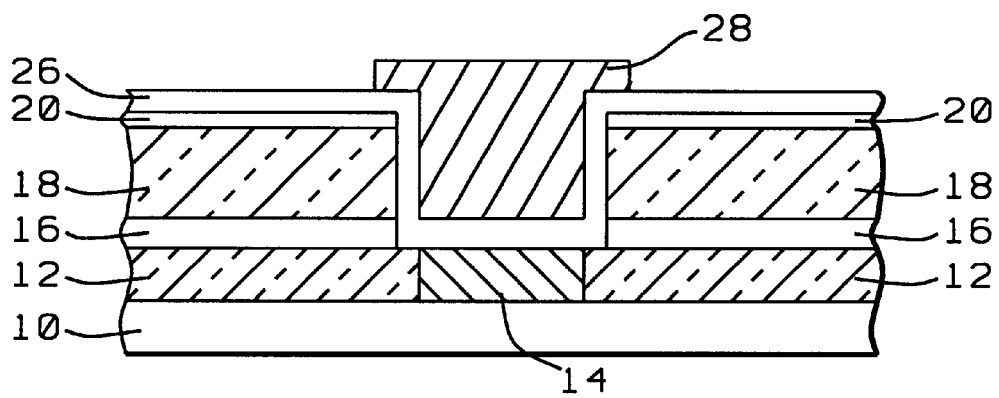
FIG. 11
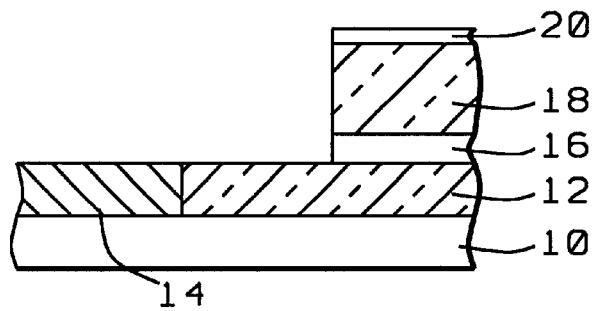
FIG. 12
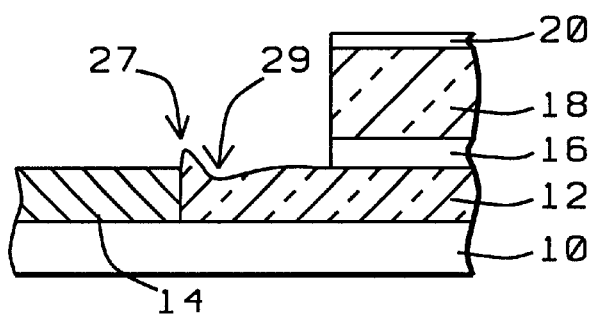
FIG. 13 — Prior Art

CU SECOND ELECTRODE PROCESS WITH IN SITU ASHING AND OXIDATION PROCESS

BACKGROUND OF THE INVENTION (1) Field of the Invention

The invention relates to the fabrication of integrated circuit devices, and more particularly, to a method of creating the second electrode of a Metal-Insulation-Metal (MIM) capacitor while preventing corner spiking which typically results in leakage current.

(2) Description of the Prior Art

One of the materials that is used during the creation of semiconductor devices is silicon nitride. As an example, silicon nitride can be used as a layer of insulation between the first and the second electrode of a Metal Insulator Metal (MIM) capacitor, forming the capacitor dielectric of the MIM capacitor. A frequently used layer of insulation is a stacked layer of oxide-nitride-oxide (ONO) which is more precisely defined as a layer of silicon oxide over which a layer of silicon nitride over which a layer of silicon oxide is deposited. In the layer of oxide-nitride-oxide, the first layer of oxide is native oxide. The silicon nitride is grown in a low power furnace,,typically to a thickness within the range of between 40 and 60 Angstrom, after which the final layer of silicon oxide is grown. Layers of silicon nitride have however been recognized as being prone to the occurrence of molecular irregularities that occur at the interface of the silicon nitride layer with other surfaces. These molecular irregularities are most frequently classified as concentrations of negative charge carriers in the surface of the silicon nitride layer. These molecular irregularities cause an undesired interface between the layer of silicon nitride and an overlying layer and can result in leakage currents between the overlying layers or in an unsatisfactory threshold voltage barrier between the adjacent layers of which the layer of silicon nitride is one of the layers. Several approaches have been used to remove surface irregularities from the surface of a layer of silicon nitride. One of these methods applies a temperature bake to the surface. Anneals at elevated temperatures are frequently used in the semiconductor art with the objective of eliminating undesired molecular disturbances. Another approach is to remove a small layer of silicon nitride from the surface of the layer and to therewith remove the negative charge carriers in the surface of the silicon nitride layer. The high temperature anneal of the surface of the layer of silicon nitride is for a number of applications of limited value since this high temperature processing is likely to affect and disturb other interfaces and elements of a semiconductor device.

One of the more detrimental effects of exposing semiconductor surfaces to ambient air is that elements contained in the air affect the exposed surface, in many instances with undesirable results. It is for instance well known in the art that copper has the disadvantage of being readily oxidized at relatively low temperatures. The high susceptibility of copper to oxidation means that conventional photoresist processing cannot be used when the copper is to be patterned into various shapes, such as interconnect traces or damascene structures, because the photoresist needs to be removed at the end of the process by heating it in a highly oxidized environment, such as an oxygen plasma, thereby converting it to an easily removed ash.

As part of the creation of semiconductor devices, the creation of layers of oxide over a surface is frequently used in a controlled manner, such as for instance the creation of a layer of pad oxide for gate electrodes. The removal of concentrations of negative charge carriers in the surface of the silicon nitride layer may therefore also be considered possible by exposing the silicon nitride layer to air, causing oxidation of the surface of the layer of silicon nitride which can then be removed by various methods. This method however is without promise since silicon nitride does not oxidize.

The invention addresses the creation of a copper MIM capacitor, which uses silicon nitride as a layer of insulation for the dielectric. Conventional methods of creating an opening for the second electrode expose the surface of the dielectric over which the second electrode is then created. Conventional processes that are used for the creation of the opening for the second electrode cause surface irregularities (spiking in the surface) of the exposed layer of silicon nitride. These irregularities most typically occur in the surface interface between the layer of silicon nitride and the adjacent copper (corner spiking). The invention addresses this problem and provides a method where the surface of the layer of silicon nitride can be exposed without causing surface irregularities in the surface of the exposed layer of silicon nitride.

U.S. Pat. No. 5,434,109 (Geissler et al.) shows a process to oxidize silicon nitride.

U.S. Pat. No. 6,127,089 (Subramanian et al.), U.S. Pat. No. 6,072,227 (Yau et al.) and U.S. Pat. No. 6,153,514 (Wang et al.) show related dual damascene processes.

SUMMARY OF THE INVENTION

A principle objective of the invention is to provide a method for creating a Metal Insulation Metal (MIM) capacitor of improved performance.

Another objective of the invention is to provide a method of creating a MIM. capacitor having an improved interface between the capacitor dielectric and the overlying second electrode of the capacitor.

Yet another objective of the invention is to provide a method of creating a MIM capacitor that has low leakage current between the first and the second electrode of the capacitor.

In accordance with the objectives of the invention a new method is provided for the creation of an opening over which the second electrode of a MIM capacitor is to be deposited. The first electrode of the MIM is created in a first layer of Fluorine doped Silicon dioxide ($SiO_2$) Glass (FSG). A layer of insulation comprising silicon nitride is deposited over the surface of the first electrode. A second layer of Fluorine doped Silicon dioxide ($SiO_2$) Glass (FSG) is deposited over the surface of the layer of silicon nitride, an etch stop layer of silicon nitride is deposited over the surface of the second layer of FSG. The layers of etch stop and the second layer of FSG are patterned and etched using a dry etch, stopping on the layer of insulation and exposing the surface of the layer of insulation. Next and of critical importance to the invention is a step of photoresist ashing and oxidation of the surface of the layer of silicon nitride. The layer of photoresist can now be removed while concurrently, using a wet strip, the layer of silicon nitride oxidation is removed from the surface of the layer of silicon nitride. The process of creating a MIM capacitor can then proceed by creating the second electrode of the MIM capacitor.

BRIEF DESCRIPTION OF THE DRAWINGS

FIG. 11 shows a cross section after the second layer of copper has been etched, creating the second electrode of the capacitor. The developed second layer of photoresist has been removed, completing the MIM capacitor.

FIGS. 12 and 13 show cross sections of a conventional process and highlight the occurrence of surface spiking in the interface between copper and surrounding dielectric.

DESCRIPTION OF THE PREFERRED EMBODIMENTS

Figure 1:
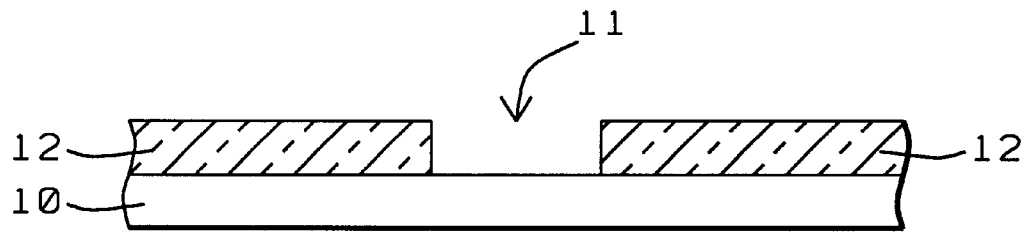
FIG. 1 is a cross section of the surface of a silicon substrate, a first layer of dielectric has been deposited over the substrate, and an opening has been created in the layer of dielectric.

Referring now specifically to FIG. 1, there is shown a cross section of the surface 10 of a silicon substrate, a first layer 12 of dielectric has been deposited over the substrate, an opening 11 has been created in the layer of dielectric.

Figure 2:
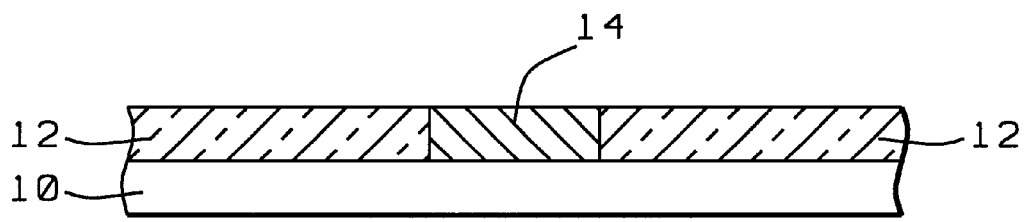
FIG. 2 is a cross section after the opening in the layer of dielectric has been filled with a layer of copper, creating a first electrode of a MIM capacitor.

The first layer 12 of dielectric preferably comprises Fluorine doped Silicon dioxide ($SiO_2$) Glass (FSG), deposited to a thickness of between about 6000 and 8000 Angstrom but more preferably to a thickness of about 4000 Angstrom. For the layer 12 a layer of High Density Plasma Fluorine doped Silicon dioxide ($SiO_2$) Glass (HDP-FSG) can be used and can be deposited using carbon tetrafluoride ($CF_4$), oxygen ($O_2$) and argon (Ar) while hydrogen ($H_2$) is later added to the gas to remove excessive fluorine from the reaction mixture during deposition. Layer 12 has been anisotropically plasma etched to form opening 11 that penetrates the layer 12 down to the surface of the substrate 10. HDP-PSG can be used since this dielectric has a lower dielectric constant than conventional chemical vapor deposition oxides. Opening 11 is created with the objective of creating a first electrode of a Metal-Insulation-Metal (MIM) capacitor therein. To this end a layer 14 of metal, preferably copper under the processes of the invention, is deposited over the surface of layer 12 using conventional methods of metal deposition with as a preferred method the method of electroplating. After the layer 14, FIG. 2, of preferably copper has been deposited over the surface of layer 12, the surface of the layer of metal is polished suing methods of Chemical Mechanical Polishing (CMP) down to essentially the surface of layer 12. This creates the metal plug of copper that is shown in cross section as plug 14, FIG. 2.

Figure 3:
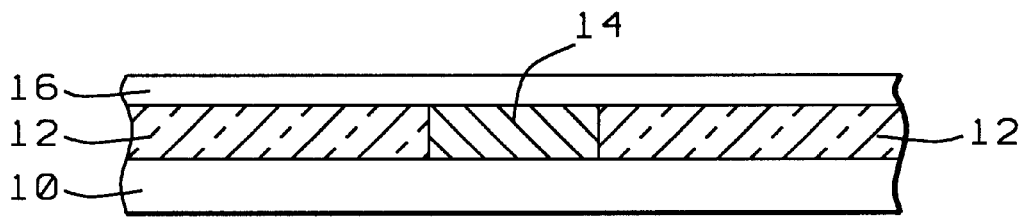
FIG. 3 shows a cross section after a first layer of silicon nitride has been deposited over the surface of the first layer of dielectric.

The process continues, FIG. 3, with the deposition of a first layer 16 of etch stop material, preferably silicon nitride, over the surface of the polished layer 12, thereby including the surface of the copper plug 14. The layer 16 of silicon nitride d ($Si_3N_4$) can be deposited using LPCVD or PECVD procedures at a pressure between about 300 mTorr and 400 mTorr, at a temperature between about 600 and 800 degrees C., to a thickness :of about between about 2000 and 3000 Angstrom but more preferably to a thickness of about 2500 Angstrom using $NH_3$ and $SiH_4$. The silicon nitride layer 16 can also be using $NH_3$ and $SiH_4$. The silicon nitride layer 16 can also be deposited using LPCVD or PECVD procedures using a reactant gas mixture such as dichlorosilane ($SiCl_2H_2$) and amonia ($NH_3$)

The layer 16 of silicon nitride is deposited with the objective of and plays a role in the creation of-an opening that is used for the creation of the capacitor dielectric and the second electrode of the MIM capacitor. Before an opening can be created, a layer that is going to contain the opening must be deposited. This layer must then be etched in order to create the referred to opening. For this process of etch, etch stop layer 16 is deposited. It has been pointed out that this etch, using conventional methods, results in the occurrence of surface irregularities (spiking) on the surface of layer 12 where this layer interfaces with the copper plug 14. This spiking is to be avoided since the spiking surface penetrates the dielectric layer of the MIM capacitor to a measurable degree and therefore causes leakage current between the first and the second electrode of the MIM capacitor. This latter statement can readily be interpreted by examining the cross section of the completed MIM capacitor that is shown in FIG. 11.

Figure 4:
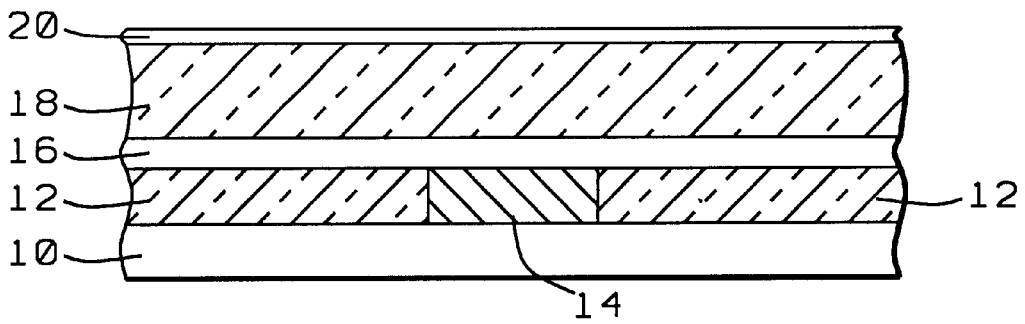
FIG. 4 shows a cross section after a second layer of dielectric and a second layer of silicon nitride have been deposited.

Proceeding now with the invention, FIG. 4 shows a cross section of the surface 10 of a silicon substrate after a second layer 18 of dielectric, comprising Fluorine doped Silicon dioxide ($SiO_2$) Glass (FSG), has been deposited. A second etch stop layer 20 has been deposited over the surface of layer 18 of dielectric. The second layer 18 of FSG is deposited to a thickness of between about 10,000 and 50,000 Angstrom but more preferably to a thickness of about 30,000 Angstrom. Layer 18 of FSG can be deposited using carbon tetrafluoride ($CF_4$), oxygen ($O_2$) and argon (Ar) while hydrogen ($H_2$) is later added to the gas to remove excessive fluorine from the reaction mixture during deposition.

The second layer 20 of etch stop material, preferably silicon nitride ($Si_3N_4$) can be deposited using LPCVD or PECVD procedures at a pressure between about 300 mTorr and 400 mTorr, at a temperature between about 600 and 800 degrees C., to a thickness of about between about 2000 and 3000 Angstrom but more preferably to a thickness of about 2500 Angstrom using $NH_3$ and $SiH_4$. The silicon nitride layer 16 can also be deposited using LPCVD or PECVD procedures using a reactant gas mixture such as dichlorosilane ($SiCl_2H_2$) and ammonia ($NH_3$).

Figure 5:
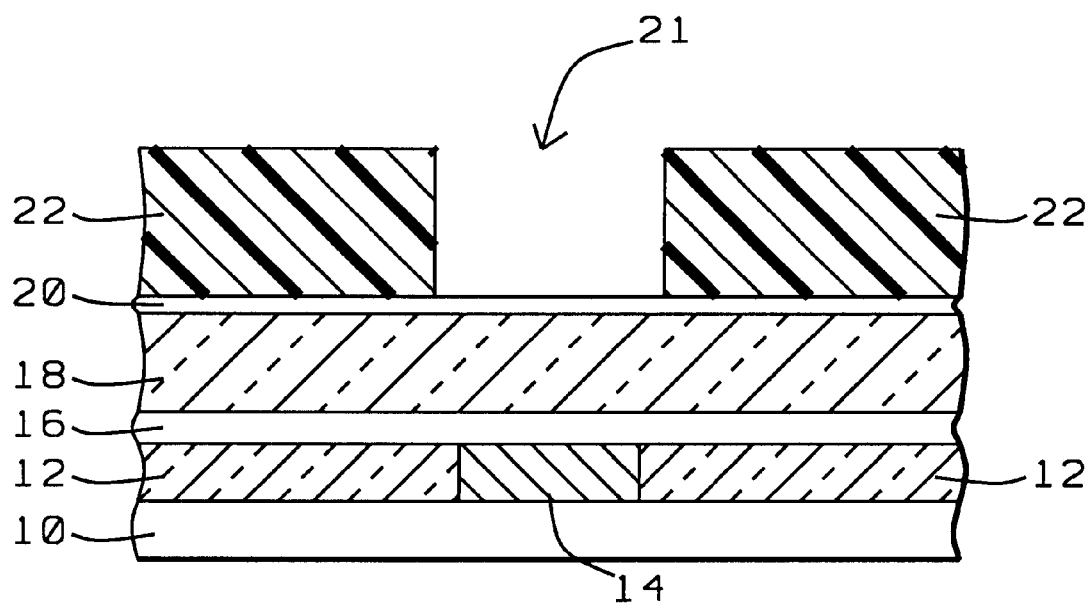
FIG. 5 shows a cross section after a first layer of photoresist has been deposited over the surface of the second layer of silicon nitride and developed, creating an opening in the first layer of photoresist that aligns with the first electrode of the capacitor.

The surface of the structure that is shown in cross section in FIG. 4 next needs to be prepared for the previously indicated etch that creates an opening in the layer 18. For this purpose, a layer 22, FIG. 5, of photoresist is spin coated over the surface of the second etch stop layer 20. The process of deposition and patterning the layer 22 of photoresist uses conventional methods of photolithography and masking. Layer 22 of photoresist can be etched by applying $O_2$ plasma and then wet stripping by using a $H_2SO_4$, $H_2O_2$ and $NH_4OH$ solution. The opening 21 that is in this manner created in the layer 22 of photoresist exposes the surface of the layer 20 of nitride and aligns with the underlying cooper plug 14. The structure that is shown in cross section in FIG. 5 is now ready to be etched, the results of which are shown in cross section in FIG. 6.

Layer 20 of silicon nitride has been etched first. The preferred method of the invention for the etch of the layer 20 is a dry etch such as applying an RIE etch using $CHF_3$ or $SF_6-O_2$ as an etchant. Layer 18 of FSG is etched after an opening has been created in layer 20 in accordance with the opening 21 in the layer 22 of photoresist. The etch of layer 18 of FSG is a continuation of the etch of layer 20 of silicon nitride and is therefore also preferred to be a dry etch.

The preferred processing conditions for the dry etch of layer 18 of FSG applies, as a continuation of the etch of layer 20 of silicon nitride, a flow rate of between about 15 and 800 sccm, at a temperature of between about 0 and 60 degrees C., at a pressure between about 10 and 150 mTorr, applied for a time between about 60 and 200 seconds.

Figure 6:
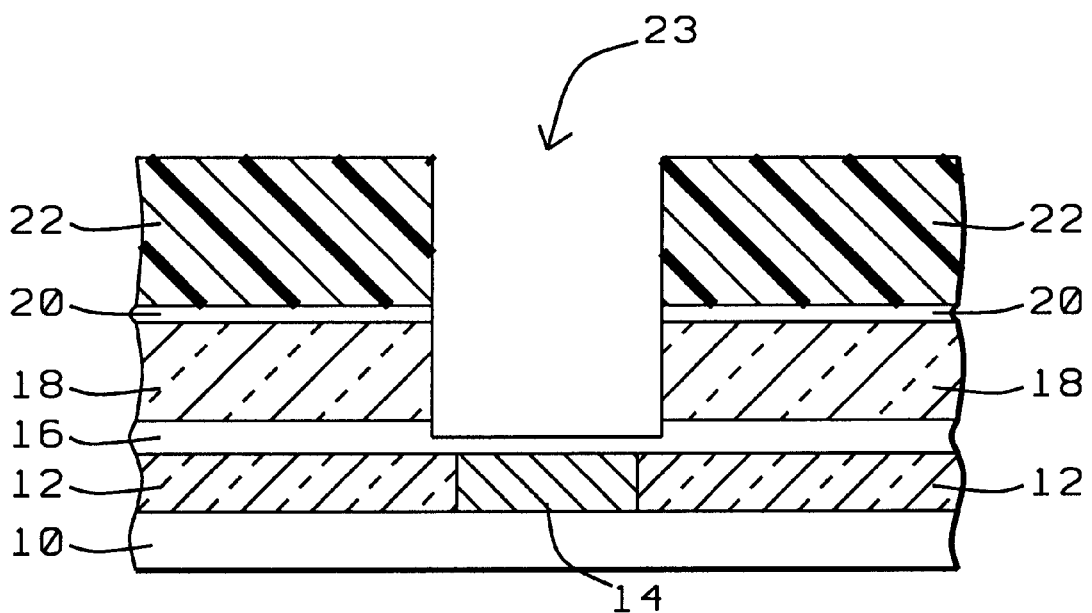
FIG. 6 shows a cross section after the second layer of silicon nitride and the second layer of dielectric have been etched in accordance with the opening created in the first layer of dielectric, the first layer of silicon nitride has been used as an etch stop layer.

It is clear from the cross section that is shown in FIG. 6 that layer 16 of silicon nitride is used as etch stop layer for the creation of opening 23 in the layers 20 and 18. FIG. 6 shows that, as a consequence of the creation of the opening 23, the thickness of layer 16 has been reduced by a measurable amount as a consequence of this layer 16 being an etch stop layer.

Figure 7:
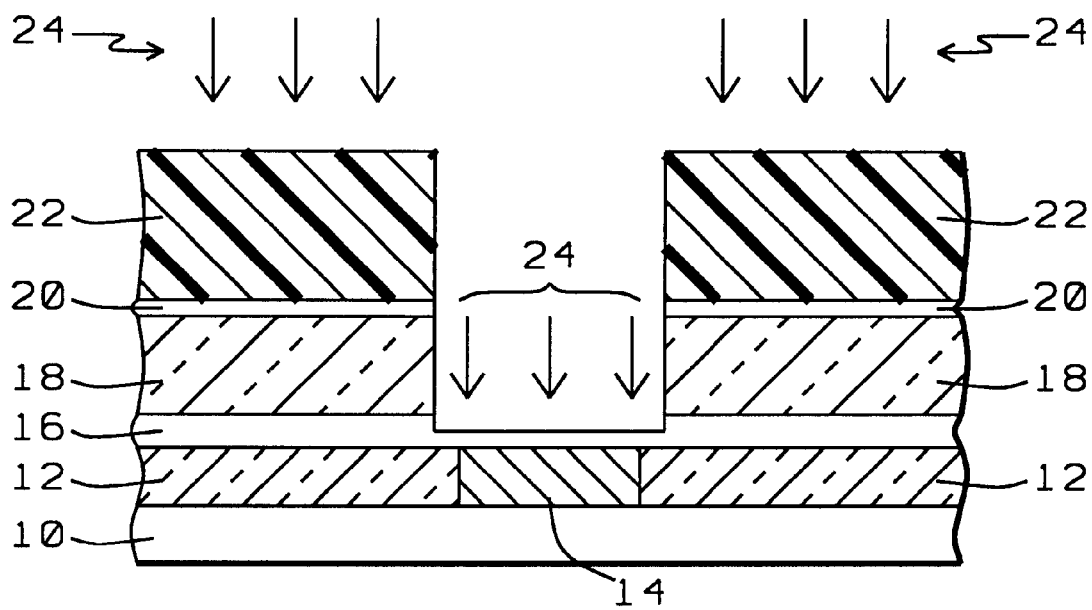
FIG. 7 shows a cross section during an essential step of the invention, that is a step of photoresist ashing and oxide plasma treatment of the surface of the first silicon nitride layer.

FIG. 7 shows a critical step of the invention where exposed surfaces, particularly of layer 16 of silicon nitride, are subjected to oxide plasma exposure 24 which at the same time results in converting layer 22 of photoresist, ashing the layer 22 of photoresist for easy removal.

A layer of photoresist can be removed by applying $O_2$ plasma 24 (FIG. 7) and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The layer of oxygen silicon nitride, which has been created on the surface of layer 16 by oxidation by the application of the $O_2$ plasma, can readily by removed by a solution of an organic, fluoride based solvent such as ST250.

Figure 8:
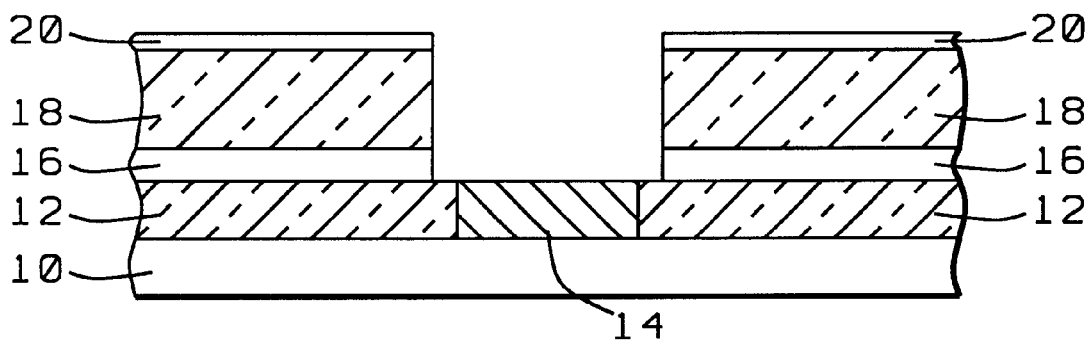
FIG. 8 is a cross section after the developed first layer of photoresist has been removed.

FIG. 8 shows a cross section after the oxidized layer that has been formed on the surface of layer 16 by the silicon nitride oxidation process has been removed by applying a wet strip using ST250. This is the critical point where the value and the claim of the invention are apparent. This is further shown in two cross sections of actual surfaces that have been provided in FIGS. 12 and 13.

FIG. 12 shows a partial cross section of a surface similar to the cross section that is shown in FIG. 8. The cross section that is shown in FIG. 12 is a cross section of a surface 14 that has been obtained following the up to this point described process of the invention, that is using the wet strip by applying ST250 to the surface of the oxidized layer formed on the surface of layer 14. It is clear that the surface of layers 12 and 14 are flat and devoid of any surface irregularities, most notably surface spiking. The cross section that is shown in FIG. 13 is a cross section of a surface that has been obtained using conventional methods of dry processing to remove the oxidized layer from the surface of layer 16. Shown in FIG. 13 are spike 27 and a valley shaped indent 29 that is adjacent to the spike 27. It is clear that spike 27, if this spike is present, will cause damage to the overlying layer of dielectric, raising concerns of reliability and performance.

Figure 9:
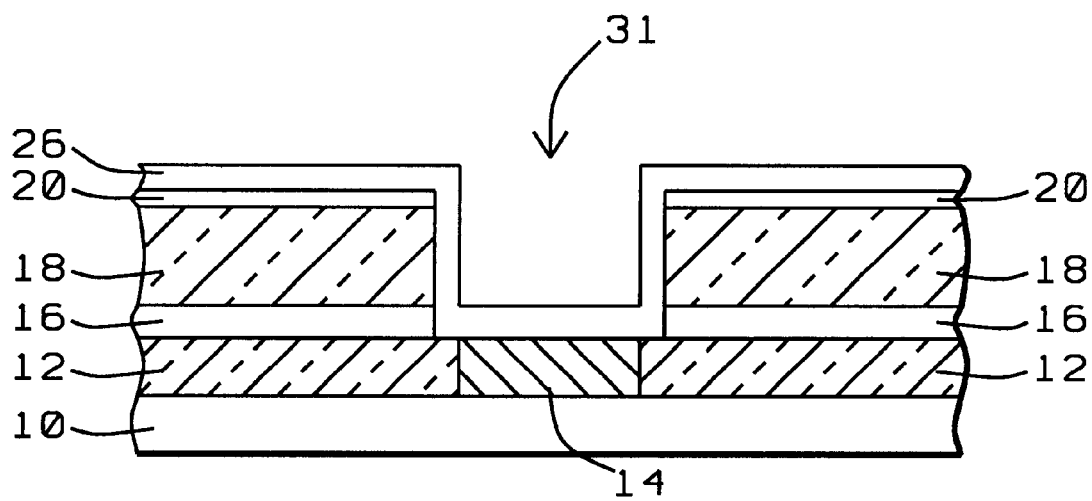
FIG. 9 shows a cross section after a layer of capacitor dielectric has been deposited.
Figure 10:
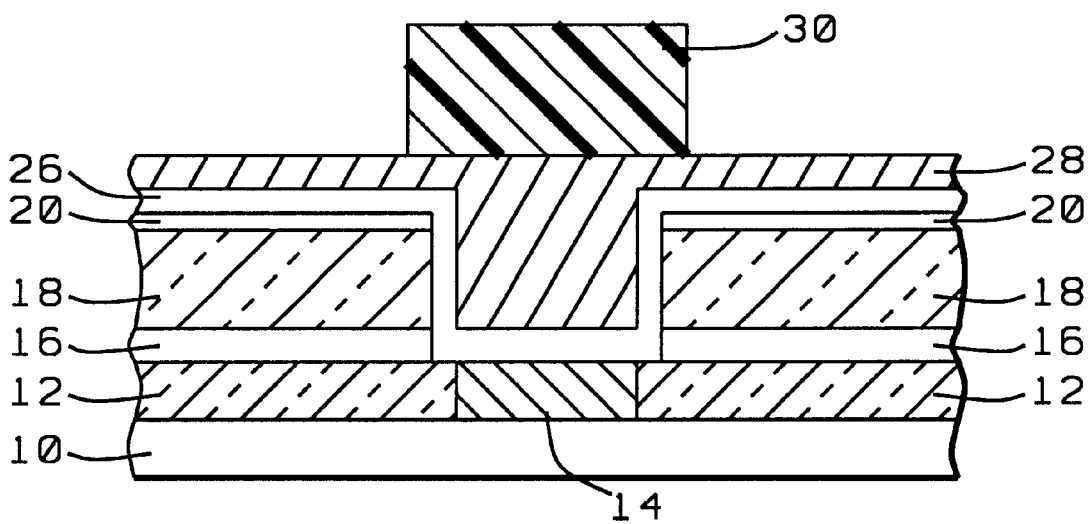
FIG. 10 is a cross section after a layer of copper has been deposited, a second layer of photoresist has been deposited and developed, leaving in place a layer of second photoresist that aligns with the first electrode of the capacitor.

FIGS. 9 through 11 show cross sections of the silicon substrate 10 during steps of completing the MIM capacitor, that is:

FIG. 9 shows a cross section after a layer 26 of capacitor dielectric has been deposited over the surface of the second etch stop layer 20, thereby including the inside surfaces of opening 31 that has been created in layers 20 of etch stop material, layer 18 of FSG and layer 16 of etch stop material.

As capacitor dielectric can be selected a material such as oxide-nitride-oxide (ONO), $Si_2O$, $Si_3N_4$, and other high dielectric constant material such as tantalum pentoxide ($TaO_5$)

FIG. 10 shows a cross section after a layer 28 of metal, preferably copper has been blanket deposited over the surface of the layer of capacitor dielectric; a layer 30 of photoresist has been deposited and developed over the surface of the blanket layer 28 of metal; the layer 30 of photoresist that remains in place overlies with the first electrode 14 of the MIM capacitor FIG. 11 shows a cross section after the layer 28 of metal has been etched in accordance with the pattern of the layer 30 of photoresist, the layer 30 of photoresist has been removed, completing the creation of the MIM capacitor.

To summarize the steps of the invention:

a semiconductor substrate is provided a first layer of dielectric is deposited over the surface of the substrate an opening is created through the first layer of dielectric, exposing the surface of the substrate the opening that has been created in the first layer of dielectric is filled with copper, creating the first electrode of a MIM capacitor a first layer of etch stop material is deposited over the surface of the first layer of dielectric, including the surface of the first electrode of the MIM capacitor a second layer of dielectric is deposited over the surface of the first layer of etch stop material a second layer of etch stop material is deposited over the surface of the second layer of dielectric the second layer of etch stop material and the second layer of dielectric are patterned and etched, creating an opening through these two layers, using the first layer of etch stop material as the etch stop, exposing the surface of the first layer of etch stop material, using a layer of photoresist for the patterning and etching of these two layers the patterned layer of photoresist and the exposed surface of the first layer of etch stop material are subjected to a oxide plasma converting the layer of photoresist to easily removed ash and creating a copper/oxide interface on the surface of the first layer of etch stop material the photoresist and the oxidized surface of the first layer of etch stop material is removed, leaving in place an opening through the second layer of etch stop material, trough the second layer of dielectric and through the first layer of etch stop material, exposing the surface of the first electrode of the MIM capacitor of copper the latter opening is used to complete the MIM capacitor.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating a Metal Insulator Metal (MIM) capacitor, comprising the steps of:

providing a semiconductor substrate;

forming a first electrode of said MIM capacitor on the surface of said substrate, said first electrode being formed in a first layer of dielectric;

forming a layer of capacitor dielectric of said MIM capacitor overlying said first electrode, said forming a layer of capacitive dielectric of said MIM capacitor comprising:
   (i) using an etch resist mask for creation of an opening through a second layer of etch stop material and a second layer of dielectric that aligns with said first electrode of said MIM capacitor thereby exposing a first layer of etch stop material;
   (ii) creating a protective layer of copper oxide over the surface of said first layer of etch stop material; and
   (iii) removing said etch resist mask thereby removing said protective layer of copper oxide; and forming a second electrode overlying said capacitor dielectric of said MIM capacitor.

2. The method of claim 1 wherein said forming a first electrode of said MIM capacitor on the surface of said substrate comprises the steps of:

depositing a first layer of dielectric over the surface of said substrate;

patterning and etching said first layer of dielectric, creating an opening through said first layer of dielectric, exposing the surface of said substrate;

depositing a layer of metal over the surface of said first layer of dielectric, filling said opening created in said first layer of dielectric; and polishing the surface of said deposited layer of metal down to the surface of said first layer of dielectric, leaving in place said layer of metal filling said opening created in said first layer of dielectric.

3. The method of claim 2 wherein said layer of metal comprises copper.

4. The method of claim 2 wherein said first layer of dielectric comprises Fluorine doped Silicon dioxide ($SiO_2$) Glass (FSG).

5. The method of claim 1 wherein said forming a layer of capacitor dielectric of said MIM capacitor overlying said first electrode comprises the steps of:

depositing a first layer of etch stop material over the surface of sa id first layer of dielectric;

depositing a second layer of dielectric over the surface of said first layer of etch stop material;

depositing a second layer of etch stop material over the surface of said second layer of dielectric;

creating a patterned and developed layer of photoresist overlying the surface of said second layer of etch stop material, creating an opening through said layer of photoresist that aligns with said first electrode of said MIM capacitor;

etching said second layer of etch stop material and said second layer of dielectric in accordance with said opening created in said layer of photoresist, creating an opening through said second layer of etch stop material and said second layer of dielectric that aligns with said first electrode of said MIM capacitor, using said first layer of etch stop material as an etch stop layer, exposing the surface of said first layer of etch stop material;

subjecting said patterned and developed layer of photoresist and said exposed surface of said first layer of etch stop material to a oxide plasma treatment, converting said photoresist to easily removable photoresist, creating a layer of copper oxide on the surface of said first layer of etch stop material;

removing said layer of photoresist and said layer of copper oxide, exposing the surface of said second layer of etch stop material, creating an opening through said first layer of etch stop material thereby further exposing the surface of said first electrode of said MIM capacitor; and depositing a layer of capacitor dielectric over the surface of said second layer of etch stop material and said exposed surface of said first electrode of said MIM capacitor, including sidewalls of said opening created through said second layer of etch stop material and said second layer of dielectric and said first layer of etch stop material.

6. The method of claim 5 wherein said depositing a first layer of etch stop material comprises depositing a layer of silicon nitride ($Si_3N_4$).

7. The method of claim 5 wherein said depositing a second layer of dielectric comprises depositing a layer of Fluorine doped Silicon dioxide ($SiO_2$) Glass (FSG).

8. The method of claim 5 wherein said depositing a second layer of etch stop material comprises depositing a layer of silicon nitride ($Si_3N_4$).

9. The method of claim 5 wherein said etching said second layer of etch stop material and said second layer of dielectric in accordance with said opening created in said layer of photoresist comprises applying a dry etch process.

10. The method of claim 5 wherein said subjecting said patterned and developed layer of photoresist and said exposed surface of said first layer of etch stop material to an oxide plasma treatment comprises applying $O_2$ plasma.

11. The method of claim 5 wherein said removing said layer of photoresist and said layer of copper oxide comprises wet stripping by using $H_2SO_4$, $H_2O_2$ and $NH_4OH$ solution.

12. The method of claim 5 wherein depositing a layer of capacitor dielectric comprises depositing a layer of material that is selected from the group consisting of oxide-nitride-oxide (ONO), $Si_2O$, $Si_3N_4$ and other high dielectric constant material such as tantalum pentoxide ($TaO_5$).

13. The method of claim 1 wherein said forming a second electrode overlying said capacitor dielectric of said MIM capacitor comprises the steps of:

depositing a layer of metal over the surface of the layer of capacitor dielectric;

depositing a layer of photoresist over the surface of said layer of metal;

patterning and etching said layer of photoresist, leaving in place a layer of photoresist that aligns with said first electrode of said MIM capacitor;

etching said layer of metal in accordance with said patterned layer of photoresist overlying said layer of metal, and removing said patterned layer of photoresist from said layer of metal.

14. The method of claim 13 wherein said layer of metal comprises copper.

15. A method of creating an opening in a second layer of dielectric, said opening overlying a copper plug having been formed in a first layer of dielectric, comprising the steps of:

providing a semiconductor substrate, said substrate having been provided with a first layer of dielectric over the surface thereof, an opening having been created through said first layer of dielectric, said opening having been filled with a layer of copper;

depositing a stack of semiconductor materials over the surface of said first layer of dielectric, said deposition comprising a first layer of etch stop material deposited over the surface of said first layer of dielectric over which a second layer of dielectric is deposited over which a second layer of etch stop material is deposited;

depositing a layer of photoresist over the surface of said stack of semiconductor materials;

patterning and developing said layer of photoresist, creating an opening in said layer of photoresist that aligns with said layer of copper having been provided in said first layer of dielectric;

etching said stack of semiconductor materials in accordance with said opening created in said developed layer of photoresist, creating openings through said second layer of etch stop material and said second layer of dielectric, using said first layer of etch stop material as an etch stop barrier, exposing the surface of said first layer of etch stop material;

exposing the surface of said developed layer of photoresist and the exposed surface of said first layer of etch stop material to an oxide plasma, converting said developed layer of photoresist to a removable ash, creating a layer of copper oxide on the surface of said first layer of etch stop material; and removing said converted layer of photoresist and said layer of copper oxide, exposing the surface of said second layer of etch stop material, extending said opening created through said second layer of etch stop material and said second layer of dielectric to now further extend through said first layer of etch stop material, exposing the surface of said layer of copper provided in said first layer of dielectric.

16. The method of claim 15 wherein said first layer of dielectric comprises Fluorine doped Silicon dioxide ($SiO_2$) Glass (FSG).

17. The method of claim 15 wherein said depositing a first layer of etch stop material comprises depositing a layer of silicon nitride ($Si_3N_4$).

18. The method of claim 15 wherein said depositing a second layer of dielectric comprises depositing a layer of Fluorine doped Silicon dioxide ($SiO_2$) Glass (FSG).

19. The method of claim 15 wherein said depositing a second layer of etch stop material comprises depositing a layer of silicon nitride ($Si_3N_4$).

20. The method of claim 15 wherein said exposing the surface of said developed layer of photoresist and the exposed surface of said first layer of etch stop material to an oxide plasma comprises applying $O_2$ plasma.

21. The method of claim 15 wherein said removing said converted layer of photoresist and said layer of copper oxide comprises wet stripping by using $H_2SO_4$, $H_2O_2$ and $NH_4OH$ solution.

22. The method of claim 15 with additional steps of creating a Metal Insulator Metal capacitor, said additional steps comprising:

depositing a layer of capacitor dielectric over the surface of said second layer of etch stop material and the surface of said layer of copper provided in said first layer of dielectric, including sidewalls of said opening created through said second layer of etch stop material and said second layer of dielectric and said first layer of etch stop material;

depositing a layer of copper over the surface of the layer of capacitor dielectric;

depositing a layer of photoresist over the surface of said layer of copper;

patterning and etching said layer of photoresist, leaving in place a layer of photoresist that aligns with said layer of copper provided in said first layer of dielectric;

etching said layer of copper in accordance with said patterned layer of photoresist overlying said layer of copper, and removing said patterned layer of photoresist from said layer of copper.

23. The method of claim 22 wherein depositing a layer of capacitor dielectric comprises depositing a layer of material that is selected from the group consisting of oxide-nitride-oxide (ONO), $Si_2O$, $Si_3N_4$ and other high dielectric constant material such as tantalum pentoxide ($TaO_5$).

* * * * *